US006461789B1

(12) United States Patent
Hatakeyama et al.

(10) Patent No.: US 6,461,789 B1
(45) Date of Patent: Oct. 8, 2002

(54) POLYMERS, CHEMICAL AMPLIFICATION RESIST COMPOSITIONS AND PATTERNING PROCESS

(75) Inventors: Jun Hatakeyama; Jun Watanabe; Yuji Harada, all of Nakakubiki-gun (JP)

(73) Assignee: Shin-Etsu Chemical Co., Ltd. (JP)

( * ) Notice: Subject to any disclaimer, the term of this patent is extended or adjusted under 35 U.S.C. 154(b) by 57 days.

(21) Appl. No.: 09/643,969

(22) Filed: Aug. 23, 2000

(30) Foreign Application Priority Data

Aug. 25, 1999 (JP) ............................................ 11-238793

(51) Int. Cl.$^7$ ............................................... G03F 7/038
(52) U.S. Cl. .................... 430/270.1; 430/905; 430/320; 430/322; 430/907; 525/332.3; 525/61; 521/141; 524/459
(58) Field of Search .............................. 430/270.1, 905, 430/909, 907, 320, 330, 322, 350; 525/332.3, 61; 524/459; 521/141

(56) References Cited

U.S. PATENT DOCUMENTS

| 3,362,822 A | * | 1/1968 | Haas et al. .................... 96/29 |
| 3,444,150 A | * | 5/1969 | Haas et al. .................... 260/37 |
| 4,139,381 A | * | 2/1979 | Bloom et al. .................... 96/3 |
| 4,491,628 A | | 1/1985 | Ito et al. |
| 5,843,624 A | | 12/1998 | Houlihan et al. |
| 5,968,713 A | | 10/1999 | Nozaki et al. |
| 5,998,099 A | | 12/1999 | Houlihan et al. |
| 6,001,923 A | * | 12/1999 | Moncur et al. ............. 524/590 |
| 6,013,416 A | | 1/2000 | Nozaki et al. |
| 6,060,213 A | * | 5/2000 | Kodama ................. 430/270.1 |
| 6,114,467 A | * | 9/2000 | Ober et al. .............. 525/332.3 |

FOREIGN PATENT DOCUMENTS

| JP | 63-27829 | 2/1988 | | |
| JP | 2-27660 | 6/1990 | | |
| JP | 9-73173 | 8/1997 | | |
| JP | 9-230595 | 9/1997 | | |
| JP | 10-10739 | 1/1998 | | |
| JP | 11291627 A | * 10/1999 | ........... | B41M/5/26 |
| JP | 2001133979 A | * 5/2001 | ............ | G03F/7/39 |
| WO | 97/33198 | 9/1997 | | |

OTHER PUBLICATIONS

Schmaljohann et al. Design strategies for 157 nm sinlge layer photoresists: lithographic evaluation of a poly(a–trifluoromethyl vinyl alcohol) copolymer; Proc. SPIE vol. 3999, p. 330–334, Advances in Resist Technology and Processing XVII. Pub. Jun. 2000.*
English Abstract for JP 63–27829.

* cited by examiner

Primary Examiner—Janet Baxter
Assistant Examiner—Yvette M. Clarke
(74) Attorney, Agent, or Firm—Millen, White, Zelano & Branigan, P.C.

(57) ABSTRACT

Polymers comprising fluorinated vinyl alcohol units and having acid labile groups partially introduced are novel. Using such polymers, resist compositions featuring transparency to excimer laser light and alkali solubility are obtained.

26 Claims, No Drawings

POLYMERS, CHEMICAL AMPLIFICATION RESIST COMPOSITIONS AND PATTERNING PROCESS

This invention relates to polymers useful as the base resin in chemical amplification resist compositions suited for microfabrication. It also relates to chemical amplification resist compositions comprising the polymers, and a patterning process using the same.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. In particular, the change-over from i-line (365 nm) to shorter wavelength KrF laser (248 nm) brought about a significant innovation, enabling mass-scale production of 0.18 micron rule devices. To the demand for a resist material with a higher resolution and sensitivity, acid-catalyzed chemical amplification positive working resist materials are effective as disclosed in U.S. Pat Nos. 4,491,628 and 5,310,619 (JP-B 2-27660 and JP-A 63-27829). They now become predominant resist materials especially adapted for deep UV lithography.

Resist materials adapted for KrF excimer lasers enjoyed early use on the 0.3 micron process, went through the 0.25 micron rule, and currently entered the mass production phase on the 0.18 micron rule. Engineers have started investigation on the 0.15 micron rule, with the trend toward a finer pattern rule being accelerated.

A wavelength change-over from KrF to shorter wavelength ArF laser (193 nm) is expected to enable miniaturization of the design rule to 0.13 μm or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198. With respect to $F_2$ excimer laser (157 nm) which is expected to enable further miniaturization to 0.10 μm or less, more difficulty arises in insuring transparency because it was found that acrylic resins are not transmissive to light at all and those cycloolefin resins having carbonyl bonds have strong absorption. As long as the inventor has confirmed, polyvinylphenol has a window for transmittance in proximity to 160 nm, so the absorption is somewhat improved, but far below the practical level, and reducing carbonyl and carbon-to-carbon double bonds is essential for insuring a transmittance. SUMMARY OF THE INVENTION An object of the invention is to provide a novel polymer having a high transmittance to vacuum ultraviolet radiation of up to 300 nm, especially of 157 nm, 146 nm and 126 nm, and useful as the base resin in a chemical amplification resist composition. Another object is to provide a chemical amplification resist composition comprising the polymer, and a patterning process using the same.

It has been found that using a resin based on poly (fluorinated vinyl alcohol), a resist material featuring transparency and alkali solubility is obtained.

Specifically, polyvinyl alcohol has relatively low absorption because of the absence of carbonyl group, and halogen substitution, especially fluorine substitution on polyvinyl alcohol is effective for improving transmittance to a practically acceptable level. Since the development step of photolithography generally involves applying alkaline water to a resist film by puddling or dipping, rinsing with pure water and spin drying, it is necessary to adjust the solubility of a polymer in alkali relatively high and the solubility in pure water relatively low. Since polyvinyl alcohol is so water soluble that it is used as the base polymer in resists adapted to water development, polyvinyl alcohol has a high possibility that it is dissolved not only upon alkali development, but also upon rinsing. Then it has been found desirable to fluorinate polyvinyl alcohol to increase the acidity of alcohol for increasing its solubility in alkali, thereby enlarging the difference from the solubility in water.

In a first aspect, the invention provides a polymer comprising recurring units of the following general formula (1):

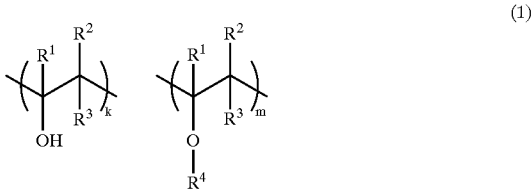

wherein at least one of $R^1$, $R^2$ and $R^3$ is fluorine or a trifluoromethyl group, and the remainder is hydrogen or a straight, branched or cyclic alkyl group of 1 to 20 carbon atoms, $R^4$ is an acid labile group, k and m are numbers in the range of $0 < k \leq 1$, $0 \leq m < 1$ and $k+m=1$.

In a second aspect, the invention provides a polymer comprising recurring units of the following general formula (2):

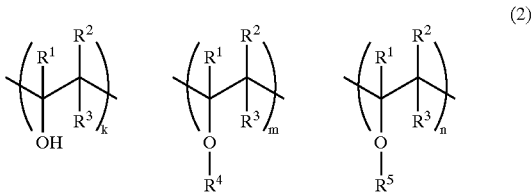

wherein at least one of $R^1$, $R^2$ and $R^3$ is fluorine or a trifluoromethyl group, and the remainder is hydrogen or a straight, branched or cyclic alkyl group of 1 to 20 carbon atoms, $R^4$ is an acid labile group, $R^5$ is an acid stable group, k, m and n are numbers in the range of $0 < k \leq 1$, $0 \leq m < 1$, $0 \leq n < 1$ and $k+m+n=1$.

In a third aspect, the invention provides a resist composition comprising the polymer of the formula (1) or (2).

In a fourth aspect, the invention provides a chemical amplification positive resist composition comprising (A) the polymer of the formula (1) or (2), (B) an organic solvent, and (C) a photoacid generator.

In a fifth aspect, the invention provides a chemical amplification negative resist composition comprising (A) the polymer of the formula (1) or (2), (B) an organic solvent, (C) a photoacid generator, and (D) a crosslinker.

The resist compositions may further include (E) a basic compound and/or (F) a dissolution inhibitor.

In a still further aspect, the invention provides a process for forming a pattern, comprising the steps of applying the resist composition onto a substrate to form a coating; heat treating the coating and exposing the coating to high energy radiation with a wavelength of up to 300 nm or electron beam through a photo-mask; optionally heat treating the exposed coating, and developing the coating with a developer.

DESCRIPTION OF THE PREFERRED EMBODIMENT

Polymer

According to the invention, the polymers are defined as comprising recurring units of the following general formula (1) or (2).

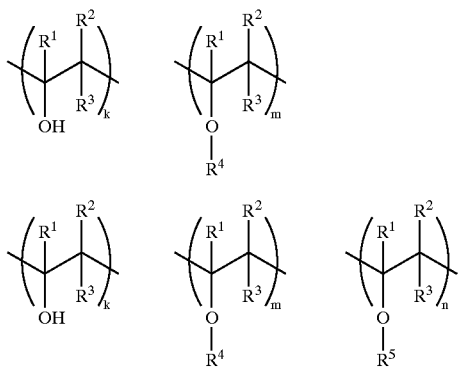

Herein at least one of $R^1$, $R^2$ and $R^3$ is a fluorine atom or a trifluoromethyl group, and the remainder is a hydrogen atom or a straight, branched or cyclic alkyl group of 1 to 20 carbon atoms, $R^4$ is an acid labile group, $R^5$ is an acid stable group, k, m and n are numbers in the range of $0<k\leq1$, $0\leq m<1$, $0\leq n<1$, and m+n=1 for formula (1) and m+n+k=1 for formula (2).

The straight, branched or cyclic alkyl groups are those of 1 to 20 carbon atoms, preferably 1 to 16 carbon atoms, and more preferably 1 to 12 carbon atoms, including methyl, ethyl, propyl, n-butyl, sec-butyl, tert-butyl, cyclopentyl, cyclohexyl, 2-ethylhexyl, and n-octyl.

The acid labile group represented by $R^4$ is selected from a variety of such groups, preferably from among the groups of the following formulae (3) and (4), tertiary alkyl groups of the following formula (5), trialkylsilyl groups whose alkyl groups each have 1 to 6 carbon atoms, and oxoalkyl groups of 4 to 20 carbon atoms.

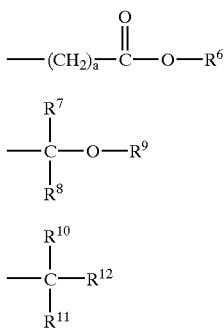

In formula (3), $R^6$ is a tertiary alkyl group of 4 to 20 carbon atoms, preferably 4 to 15 carbon atoms, a trialkylsilyl group whose alkyl groups each have 1 to 6 carbon atoms, an oxoalkyl group of 4 to 20 carbon atoms or a group of formula (4). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxoran-5-yl. Letter "a" is an integer of 0 to 6.

In formula (4), $R^7$ and $R^8$ are independently hydrogen or straight, branched or cyclic alkyl groups of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl and n-octyl. $R^9$ is a monovalent hydrocarbon group of 1 to 18 carbon atoms, preferably 1 to 10 carbon atoms, which may have a hetero atom (e.g., oxygen atom), for example, straight, branched or cyclic alkyl groups, and such groups in which some hydrogen atoms are replaced by hydroxyl, alkoxy, oxo, amino or alkylamino groups. Illustrative examples of the substituted alkyl groups are given below.

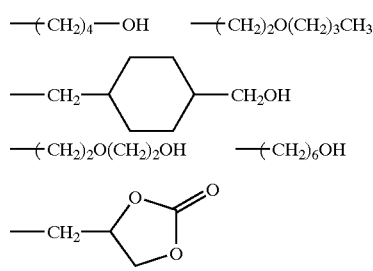

A pair of $R^7$ and $R^8$, a pair of $R^7$ and $R^{9'}$ or a pair of $R^8$ and $R^{9'}$ taken together, may form a ring. Each of $R^7$, $R^8$ and $R^9$ is a straight or branched alkylene group of 1 to 18 carbon atoms, preferably 1 to 10 carbon atoms, when they form a ring.

Illustrative examples of the acid labile groups of formula (3) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Of the acid labile groups of formula (4), illustrative examples of the straight or branched groups are given below.

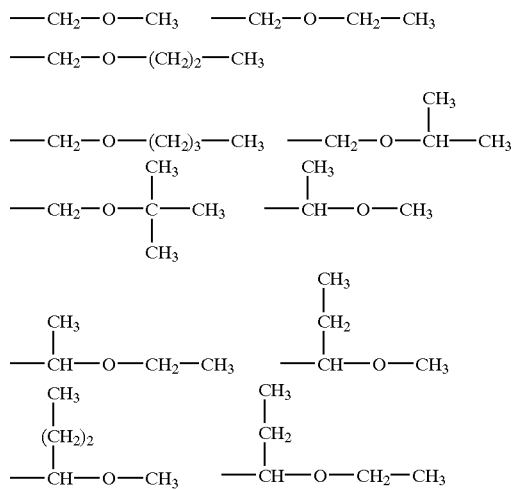

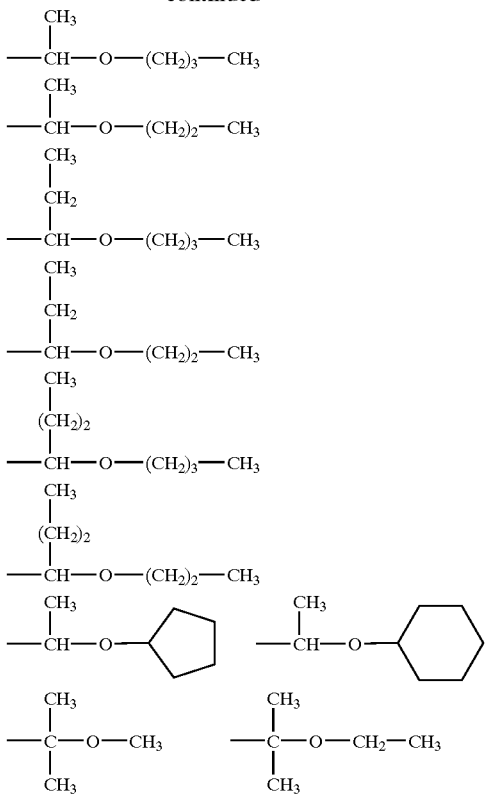

Of the acid labile groups of formula (4), illustrative examples of the cyclic groups include tetrahydrofuran-2-yl, 2-methyltetrahydrofuran-2-yl, tetrahydropyran-2-yl and 2-methyltetrahydropyran-2-yl. Preferred among the groups of formula (4) are ethoxyethyl, butoxyethyl and ethoxypropyl.

In formula (5), $R^{10}$, $R^{11}$ and $R^{12}$ are independently monovalent hydrocarbon groups, for example, straight, branched or cyclic alkyl groups of 1 to 20 carbon atoms, which may contain a hetero atom such as oxygen, sulfur, nitrogen or fluorine. A pair of $R^{10}$ and $R^{11}$, a pair of $R^{10}$ and $R^{12}$, or a pair of $R^{11}$ and $R^{12}$, taken together, may form a ring.

Examples of the tertiary alkyl group represented by formula (5) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other illustrative examples of the tertiary alkyl group are given below as formulae (5-1) through (5-16).

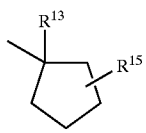 (5-1)

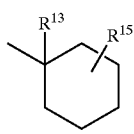 (5-2)

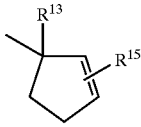 (5-3)

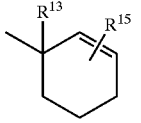 (5-4)

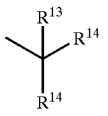 (5-5)

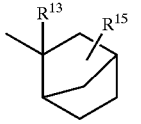 (5-6)

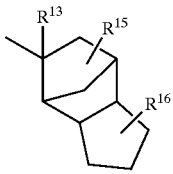 (5-7)

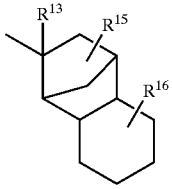 (5-8)

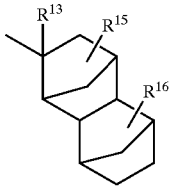 (5-9)

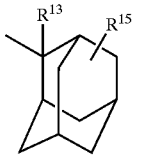 (5-10)

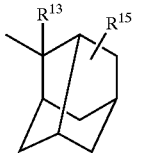 (5-11)

-continued (5-12)
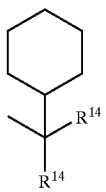

(5-13)
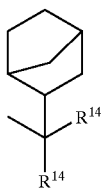

(5-14)
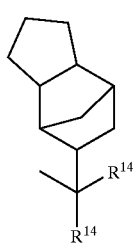

(5-15)
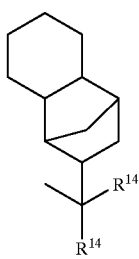

(5-16)
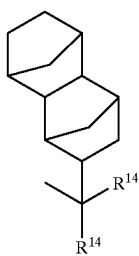

Herein, $R^{13}$ and $R^{14}$ are independently straight, branched or cyclic alkyl groups of 1 to 6 carbon atoms, for example, methyl, ethyl, propyl, isopropyl, n-butyl, sec-butyl, n-pentyl, n-hexyl, cyclopropyl and cyclopropylmethyl. $R^{15}$ is hydrogen or a monovalent hydrocarbon group of 1 to 6 carbon atoms which may contain a hetero atom or a monovalent hydrocarbon group of 1 to 6 carbon atoms, typically alkyl, which may be separated by a hetero atom. The hetero atom is an oxygen, sulfur or nitrogen atom, which is contained or intervenes in the form of —OH, —OR, —O—, —S—, —S(=O)—, —NH$_2$, —NHR, —NR$_2$, —NH, or —NR— wherein R is an alkyl group of 1 to 20 carbon atoms, and especially 1 to 16 carbon atoms.

$R^{16}$ is hydrogen or an alkyl, hydroxyalkyl, alkoxyalkyl, alkoxy or alkoxyalkyl group of 1 to 20 carbon atoms, especially 1 to 16 carbon atoms, which may be straight, branched or cyclic. Illustrative examples include methyl, hydroxymethyl, ethyl, hydroxyethyl, propyl, isopropyl, n-butyl, sec-butyl, n-pentyl, n-hexyl, methoxy, methoxymethoxy, ethoxy, and tert-butoxy.

Of the acid labile group represented by $R^4$, the trialkylsilyl groups whose alkyl groups each have 1 to 6 carbon atoms include trimethylsilyl, triethylsilyl, and tert-butyldimethylsilyl.

The oxoalkyl groups of 4 to 20 carbon atoms include 3-oxocyclohexyl and groups of the following formulae.

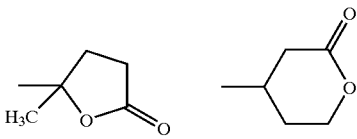

The acid stable group represented by $R^5$ is introduced for the purpose of improving etching resistance or adhesion. It is preferably selected from cyclic alkyl groups, more preferably bridged cyclic alkyl groups. Illustrative examples are given below as formulae (6-1) through (6-18).

(6-1)
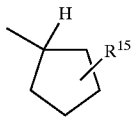

(6-2)
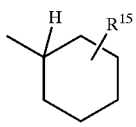

(6-3)
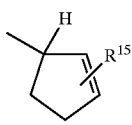

(6-4)
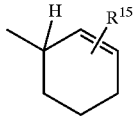

(6-5)
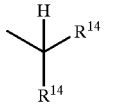

(6-6)
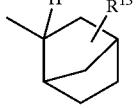

(6-7)
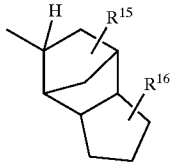

(6-8)
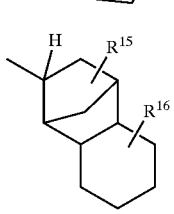

-continued (6-9) 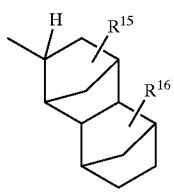

(6-10) 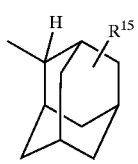

(6-11) 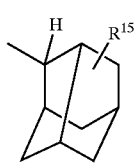

(6-12) 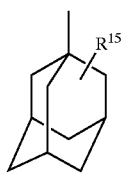

(6-13) 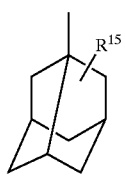

(6-14) 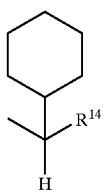

(6-15) 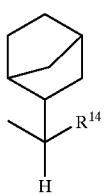

(6-16) 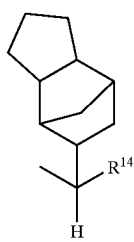

(6-17) 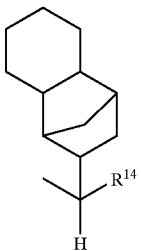

(6-18) 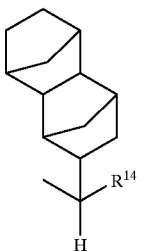

Herein, $R^{14}$, $R^{15}$ and $R^{16}$ are as defined above.

Referring back to formula (1), letters k and m are numbers in the range of $0<k\leq1$ and $0\leq m<1$. For use in positive resists, k is preferably in the range of $0.1\leq k\leq0.9$, more preferably $0.15\leq k\leq0.85$, further preferably $0.2\leq k\leq0.8$. It is noted that k+m is equal to 1.

In formula (2), k, m and n are numbers in the range of $0<k\leq1$, $0\leq m<1$, and $0\leq n<1$. Preferably k is in the range of $0.1\leq k\leq0.9$, more preferably $0.15\leq k\leq0.85$, further preferably $0.2\leq k\leq0.8$, and n is preferably in the range of $0.1\leq n\leq0.8$, more preferably $0.15\leq n\leq0.6$, further preferably $0.2\leq n\leq0.5$. It is noted that k+m+n is equal to 1.

The polymers of the invention preferably have a weight average molecular weight of about 1,000 to 1,000,000, and especially about 2,000 to 100,000.

In preparing the polymers of the invention, there may be used monomers of the following formula (1a):

$$RO\text{—}CR^1\text{=}CR^2R^3 \tag{1a}$$

wherein R is a group which leaves a hydrogen atom when eliminated, for example, $CF_3$, $CH_3$ or $CH_3C(\text{=}O)$ group, $R^1$, $R^2$, and $R^3$ are as defined above.

The monomer of formula (1a) is polymerized into a polymer comprising units of the following formula (1b):

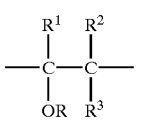
(1b)

before the -OR groups are converted into OH groups. This gives a polymer comprising units of the following formula (1').

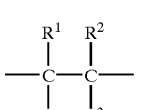
(1')

For introducing $R^4$ and $R^5$, acid labile groups and acid stable groups are substituted for the OH groups on the polymer of formula (1'). This introduction may be carried out in a conventional manner.

In general, the above polymer is prepared by mixing the above monomer with a solvent, adding a catalyst thereto, and effecting polymerization reaction while heating or cooling the system if necessary. The polymerization reaction depends on the type of initiator or catalyst, trigger means (including light, heat, radiation and plasma), and polymerization conditions (including temperature, pressure, concentration, solvent, and additives). Commonly used for polymerization to form the polymer of the invention are radical copolymerization of triggering polymerization with radicals of α,α'-azobisisobutyronitrile (AIBN) or the like, and ion (anion) polymerization using catalysts such as alkyl lithium. Such polymerization may be effected in a conventional manner.

The polymers of the invention encompass copolymers of the above-described monomer with another copolymerizable monomer. Such co-monomers include those having a double bond, for example, ethylene, propylene, perfluoroethylene, perfluoropropylene, styrene, hydroxystyrene, acrylic acid derivatives, methacrylic acid derivatives, maleic anhydride, norbornene, and vinyl alcohol derivatives. The co-monomer is preferably used in an amount of up to 5 mol, and more preferably up to 3 mol per mol of the monomer or monomers of formula (1a).

The polymers of the invention are useful as the base resin in resist compositions, and especially chemical amplification type resist compositions which may be either positive or negative working.

Resist Composition

A first embodiment of the invention is a resist composition comprising the polymer of formula (1) or (2).

A second embodiment of the invention is a chemical amplification positive resist composition comprising (A) the polymer of formula (1) or (2), (B) an organic solvent, and (C) a photoacid generator.

A third embodiment of the invention is a chemical amplification negative resist composition comprising (A) the polymer of formula (1) or (2), (B) an organic solvent, (C) a photoacid generator, and (D) a crosslinker.

In any of these embodiment, the resist composition may further contain (E) a basic compound or (F) a dissolution inhibitor or both.

Component (B)

The organic solvent used as component (B) in the invention may be any organic solvent in which the photoacid generator, base resin, dissolution inhibitor, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, preferred are diethylene glycol dimethyl ether, 1-ethoxy-2-propanol and ethyl lactate, in which the photoacid generator is most soluble, and propylene glycol monomethyl ether acetate which is safe, and mixtures thereof.

Component (C)

Suitable examples of the photoacid generator serving as component (C) include onium salts of general formula (11) below, diazomethane derivatives of formula (12), glyoxime derivatives of formula (13), β-ketosulfone derivatives, disulfone derivatives, nitrobenzylsulfonate derivatives, sulfonic acid ester derivatives, and imidoyl sulfonate derivatives.

(11)

In the formula, $R^{30}$ is a straight, branched or cyclic alkyl of 1 to 12 carbon atoms, an aryl of 6 to 12 carbon atoms, or an aralkyl of 7 to 12 carbon atoms; $M^+$ is iodonium or sulfonium; $K^-$ is a non-nucleophilic counter-ion; and the letter b is 2 or 3.

Illustrative examples of alkyl groups represented by $R^{30}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

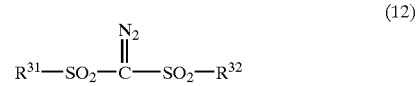
(12)

In the formula, $R^{31}$ and $R^{32}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{31}$ and $R^{32}$ include methyl, ethyl, propyl, butyl, amyl, cyclopentyl, cyclohexyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorobenzene, chlorobenzene, and 1,2,3,4,5-pentafluorobenzene. Exemplary aralkyl groups include benzyl and phenethyl.

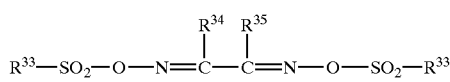

In the formula, $R^{33}$, $R^{34}$, and $R^{35}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{34}$ and $R^{35}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{33}$, $R^{34}$, and $R^{35}$ are exemplified by the same groups mentioned above for $R^{31}$ and $R^{32}$. Examples of alkylene groups represented by $R^{34}$ and $R^{35}$ include methylene, ethylene, propylene, butylene, and hexylene.

Illustrative examples of the photoacid generator include:
onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexane-sulfonyl)-αdimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; and glyoxime derivatives such as bis-o-(p-toluenesulfonyl)-α-dimethylglyoxime and bis-o-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is added in an amount of about 0.2 to 15 parts by weight, and especially about 0.5 to 8 parts by weight, per 100 parts by weight of all the base resins. At less than 0.2 part, the amount of acid generated during exposure would be too small and the sensitivity and resolution are poor, whereas the addition of more than 15 parts would lower the transmittance of the resist and results in a poor resolution.

Component (E)

The basic compound used as component (E) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives. Of these, aliphatic amines are especially preferred.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole,2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidin derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formulas (14) and (15) may also be included.

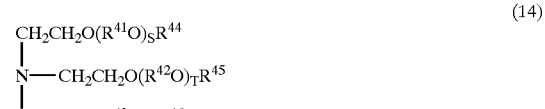

(14)

(15)

In the formulas, $R^{41}$, $R^{42}$, $R^{43}$, $R^{47}$ and $R^{48}$ are independently straight, branched or cyclic alkylenes of 1 to 20 carbon atoms; $R^{44}$, $R^{45}$, $R^{46}$, $R^{49}$ and $R^{50}$ are hydrogen, alkyls of 1 to 20 carbon atoms, or amino; $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ may bond together to form rings; and S, T and U are each integers from 0 to 20, with the proviso that hydrogen is excluded from $R^{44}$, $R^{45}$, $R^{46}$ $R^{49}$ and $R^{50}$ when S, T and U are equal to 0.

The alkylene groups represented by $R^{41}$, $R^{42}$, $R^{43}$, $R^{47}$ and $R^{48}$ preferably have 1 to 20 carbon atoms, more preferably 1 to 10 carbon atoms, and most preferably 1 to 8 carbon atoms. Examples include methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^{44}$, $R^{45}$, $R^{46}$, $R^{49}$ and $R^{50}$ preferably have 1 to 20 carbon atoms, more preferably 1 to 8 carbon atoms, and most preferably 1 to 6 carbon atoms, and may be straight, branched or cyclic. Examples include methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl.

Where $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ form rings, the rings preferably have 1 to 20 carbon atoms, more preferably 1 to 8 carbon atoms, and most preferably 1 to 6 carbon atoms, and may have branching alkyl groups of 1 to 6 carbon atoms, and especially 1 to 4 carbon atoms.

S, T, and U are each integers from 0 to 20, preferably from 1 to 10, and more preferably from 1 to 8.

Illustrative examples of the compounds of formulas (14) and (15) include tris{2-(methoxymethoxy)ethyl}amine, tris{2-(methoxyethoxy)ethyl}amine, tris[2-{(2-methoxyethoxy)methoxy}ethyl]amine, tris{(2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, and 1-aza-18-crown-6. Especially preferred basic compounds are tertiary amines, aniline derivatives, pyrrolidine derivatives, pyridine derivatives, quinoline derivatives, amino acid derivatives, hydroxyl group-bearing nitrogenous compounds, hydroxyphenyl group-bearing nitrogenous compounds, alcoholic nitrogenous compounds, amide derivatives, amide derivatives, tris{2-(methoxymethoxy)ethyl}amine, tris{2-(2-methoxyethoxy)ethyl}amine, tris[2-{(2-methoxyethoxy)methyl}ethyl]amine, and 1-aza-15-crown-5.

The above-described basic compound may be used singly or in combinations of two or more thereof, and is preferably formulated in an amount of about 0.01 to 2 parts, and especially about 0.01 to 1 part by weight, per 100 parts by weight of all the base resins. At less than 0.01 part, the desired effects of the basic compound would not be apparent, while the use of more than 2 parts would result in too low a sensitivity.

Component (F) The dissolution inhibitor (F) is a compound with a molecular weight of up to 3,000 which changes its solubility in an alkaline developer under the action of an acid. Typically, a compound obtained by partially or entirely substituting acid labile substituents on a phenol or carboxylic acid derivative having a molecular weight of up to 2,500 is added as the dissolution inhibitor.

Examples of the phenol or carboxylic acid derivative having a molecular weight of up to 2,500 include bisphenol A, bisphenol H, bisphenol S, 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, and thimolphthalein. The acid labile substituents are the same as those exemplified as the acid labile groups in the polymer.

Illustrative, non-limiting, examples of the dissolution inhibitors which are useful herein include bis(4-(2'-tetrahydropyranyloxy)phenyl)methane,
bis(4-(2'-tetrahydrofuranyloxy)phenyl)methane,
bis(4-tert-butoxyphenyl)methane,
bis(4-tert-butoxycarbonyloxyphenyl)methane,
bis(4-tert-butoxycarbonylmethyloxyphenyl)methane,
bis(4-(1'-ethoxyethoxy)phenyl)methane,
bis(4-(1'-ethoxypropyloxy)phenyl)methane,
2,2-bis(4'-(2"-tetrahydropyranyloxy))propane,
2,2-bis(4'-(2"-tetrahydrofuranyloxy)phenyl)propane,
2,2-bis(4'-tert-butoxyphenyl)propane,
2,2-bis(4'-tert-butoxycarbonyloxyphenyl)propane,
2,2-bis(4-tert-butoxycarbonylmethyloxyphenyl)propane,
2,2-bis(4'-(1"-ethoxyethoxy)phenyl)propane,
2,2-bis(4'-(1"-ethoxypropyloxy)phenyl)propane,
tert-butyl 4,4-bis(4'-(2"-tetrahydropyranyloxy)phenyl) valerate,
tert-butyl 4,4-bis(4'-(2"-tetrahydrofuranyloxy)phenyl) valerate,
tert-butyl 4,4-bis(4'-tert-butoxyphenyl)valerate,
tert-butyl 4,4-bis(4-tert-butoxycarbonyloxyphenyl)valerate,
tert-butyl 4,4-bis(4'-tert-butoxycarbonylmethyloxyphenyl) valerate,
tert-butyl 4,4-bis(4'-(1"-ethoxyethoxy)phenyl)valerate,
tert-butyl 4,4-bis(4'-(1"-ethoxypropyloxy)phenyl)valerate,
tris(4-(2'-tetrahydropyranyloxy)phenyl)methane,
tris(4-(2'-tetrahydrofuranyloxy)phenyl)methane,
tris(4-tert-butoxyphenyl)methane,
tris(4-tert-butoxycarbonyloxyphenyl)methane,
tris(4-tert-butoxycarbonyloxymethylphenyl)methane,
tris(4-(1'-ethoxyethoxy)phenyl)methane,
tris(4-(1'-ethoxypropyloxy)phenyl)methane,
1,1,2-tris(4'-(2"-tetrahydropyranyloxy)phenyl)ethane,
1,1,2-tris(4'-(2"-tetrahydrofuranyloxy)phenyl)ethane,
1,1,2-tris(4'-tert-butoxyphenyl)ethane,
1,1,2-tris(4'-tert-butoxycarbonyloxyphenyl)ethane,
1,1,2-tris(4'-tert-butoxycarbonylmethyloxyphenyl)ethane,
1,1,2-tris(4'-(1'-ethoxyethoxy)phenyl)ethane, and
1,1,2-tris(4'-(1'-ethoxypropyloxy)phenyl)ethane.

In the resist composition according to the invention, an appropriate amount of the dissolution inhibitor (F) is up to about 30 parts, and especially up to about 20 parts by weight per 100 parts by weight of the solids in the composition. With more than 30 parts of the dissolution inhibitor, the resist composition becomes less heat resistant because of an increased content of monomer components.

Component (D)

Formulated in the negative resist composition is an acid crosslinker which forms a crosslinked structure under the action of acid. Typical crosslinkers are compounds having at least two hydroxymethyl, alkoxymethyl, epoxy or vinyl ether groups within a molecule. Substituted glycoluril derivatives, urea derivatives, and hexa(methoxymethyl) melamine compounds are suitable as the acid crosslinker in the chemically amplified, negative resist composition. Examples include N,N,N',N'-tetramethoxymethylurea, hexamethoxymethylmelamine, tetraalkoxymethyl-substituted glycoluril compounds such as tetrahydroxymethyl-substituted glycoluril and tetramethoxymethylglycoluril, and condensates of phenolic compounds such as substituted or unsubstituted bis (hydroxymethylphenol) compounds and bisphenol A with epichlorohydrin. Especially preferred crosslinkers are 1,3, 5,7-tetraalkoxymethylglycolurils such as 1,3,5,7-tetramethoxymethylglycoluril, 1,3,5,7-tetrahydroxymethylglycoluril, 2,6-dihydroxymethyl-p-cresol, 2,6-dihydroxymethylphenol, 2,2', 6,6'-tetrahydroxymethylbisphenol A, 1,4-bis[2-(2-hydroxypropyl)]benzene, N,N,N',N'-tetramethoxymethylurea, and hexamethoxymethylmelamine. In the resist composition, an appropriate amount of the crosslinker is about 1 to 25 parts, and especially about 5 to 15 parts by weight per 100 parts by weight of the solids in the composition. The crosslinkers may be used alone or in admixture of two or more.

The resist composition of the invention may include, as an optional ingredient, a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, and fluorinated organosiloxane compounds. Illustrative examples include Florade FC-430 and FC-431 from Sumitomo 3M Ltd., Surflon S-141, S-145, S-381 and S-383 from Asahi Glass Co., Ltd., Unidyne DS-401, DS-403, and DS-451 from Daikin Industries Ltd., Megaface F-8151, F-171, F-172, F-173 and F-177 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the chemical amplification resist composition of the invention may be carried out by a known lithographic technique. For example, the resist composition may be applied onto a substrate such as a silicon wafer by spin coating or the like to form a resist film having a thickness of 0.1 to 1.0 $\mu$m, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation such as deep-UV rays having a wavelength below 300 nm, an excimer laser, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high-energy radiation that may be used, the resist composition of the invention is best suited to fine pattern formation with, in particular, deep-UV rays having a wavelength of 120 to 254 nm, an excimer laser, especially ArF excimer laser (193 nm), F$_2$ excimer laser (157 nm), Kr$_2$ excimer laser (146 nm) or Ar$_2$ excimer laser (126 nm), x-rays, or an electron beam. The desired pattern may not be obtainable outside the upper and lower limits of the above range.

The resist composition comprising the polymer of the invention is sensitive to high-energy radiation, has excellent sensitivity, resolution, and plasma etching resistance, and provides a resist pattern of outstanding thermal stability and reproducibility. Because these features of the inventive resist composition enable its use particularly as a resist having a low absorption at the exposure wavelength of Kr$_2$, F$_2$, ArF and KrF excimer lasers, a finely defined pattern having sidewalls perpendicular to the substrate can easily be formed, making the resist ideal as a micropatterning material in VLSI fabrication.

EXAMPLE

Examples of the invention are given below by way of illustration and not by way of limitation. AIBN denotes $\alpha\alpha'$-azobisisobutyronitrile, and THF denotes tetrahydrofuran.

Synthesis Example 1
Synthesis of poly(trifluoromethyl trifluorovinyl ether)

In a nitrogen stream, a 1-liter autoclave was charged with 300 ml of deaerated toluene and 2 g of initiator AIBN. While the autoclave was kept at a temperature of 78° C., 50 g of trifluoromethyl trifluorovinyl ether was blown into the solution. The reaction solution was cooled down to room temperature and heated again to 60° C., at which polymerization was effected for 24 hours.

In order to work up the polymer, the reaction mixture was poured into methanol whereupon the polymer precipitated. It was separated and dried, obtaining 40 g of a white polymer, poly(trifluoromethyl trifluorovinyl ether). This polymer was found to have a weight average molecular weight (Mw) of 15,500 g/mol as measured by the light scattering method and a dispersity (Mw/Mn) of 1.60 as determined from the GPC elution curve.

Synthesis Example 2
Synthesis of poly(trifluorovinyl alcohol)

A 1-liter flask was charged with 40 g of the poly (trifluoromethyl trifluorovinyl ether) obtained in Synthesis Example 1, 72 g of sodium iodide and 300 ml of acetonitrile. With stirring at room temperature, 53 g of chlorotrimethylsilane from a dropping funnel was added dropwise in such a controlled manner that the reaction temperature might not exceed 30° C. The reaction mixture was then heated at 60° C. and ripened for 24 hours.

Next, under ice cooling, 100 g of pure water was added dropwise to the reaction solution, which was heated at 60° C. and ripened for 10 hours. After decoloration with an aqueous sodium hydrogensulfite solution, the reaction solution was transferred to a separatory funnel. The upper layer was taken out, and 200 g of ethyl acetate and 100 g of toluene were added thereto. The polymer layer was washed twice with 150 g of water. The polymer solution was transferred to a dropping funnel, from which the solution was poured into hexane whereby the polymer precipitated. Separation and drying yielded 32 g of a white polymer, poly(trifluorovinyl alcohol). This polymer was found to have a weight average molecular weight (Mw) of 9,000 g/mol as measured by the light scattering method and a dispersity (Mw/Mn) of 1.65 as determined from the GPC elution curve.

Synthesis Example 3
Tetrahydropyranylation of poly(trifluorovinyl alcohol)

A 300-ml flask was charged with 20 g of the poly (trifluorovinyl alcohol) obtained in Synthesis Example 2, 0.6 g of trifluoromethanesulfonic acid and 100 ml of THF. With stirring at room temperature, 4.0 g of 3,4-dihydro-2H-pyran was added dropwise from a dropping funnel. The reaction mixture was ripened at room temperature for one hour.

Triethylamine was added to the reaction system to terminate reaction, and the solvent was distilled off under vacuum. The resulting crude polymer was dissolved in 40 g of acetone, which was poured into 5 liters of pure water with 20 g of acetic acid dissolved therein, whereupon the polymer precipitated. The procedure of dissolving the polymer in 40 g of acetone and pouring it into 5 liters of pure water for precipitation was repeated twice, following which the polymer was separated and dried. There was obtained 15 g of a white polymer, 20% tetrahydropyranylated poly(trifluorovinyl alcohol). This polymer was found to have a weight average molecular weight (Mw) of 9,600 g/mol as measured by the light scattering method and a dispersity (Mw/Mn) of 1.60 as determined from the GPC elution curve. Proton-NMR analysis confirmed that 20% of the hydroxyl groups on poly(trifluorovinyl alcohol) was converted into tetrahydropyranyl.

Synthesis Example 4
Ethoxyethylation of poly(trifluorovinyl alcohol)

A 300-ml flask was charged with 20 g of the poly(trifluorovinyl alcohol) obtained in Synthesis Example 2, 0.6 g of trifluoromethanesulfonic acid and 100 ml of THF. With stirring at room temperature, 3.4 g of ethyl vinyl ether was added dropwise from a dropping funnel. The reaction mixture was ripened at room temperature for one hour.

Triethylamine was added to the reaction system to terminate reaction, and the solvent was distilled off under vacuum. The resulting crude polymer was dissolved in 40 g of acetone, which was poured into 5 liters of pure water with 20 g of acetic acid dissolved therein, whereupon the polymer precipitated. The procedure of dissolving the polymer in 40 g of acetone and pouring it into 5 liters of pure water for precipitation was repeated twice, following which the polymer was separated and dried. There was obtained 14.5 g of a white polymer, 20% ethoxyethylated poly(trifluorovinyl alcohol). This polymer was found to have a weight average molecular weight (Mw) of 9,300 g/mol as measured by the light scattering method and a dispersity (Mw/Mn) of 1.65 as determined from the GPC elution curve. Proton-NMR analysis confirmed that 20% of the hydroxyl groups on poly(trifluorovinyl alcohol) was converted into ethoxyethyl.

Synthesis Example 5
Ethoxypropylation of poly(trifluorovinyl alcohol)

A 300-ml flask was charged with 20 g of the poly(trifluorovinyl alcohol) obtained in Synthesis Example 2, 0.6 g of trifluoromethanesulfonic acid and 100 ml of THF. With stirring at room temperature, 4.1 g of ethyl propenyl ether was added dropwise from a dropping funnel. The reaction mixture was ripened at room temperature for one hour.

Triethylamine was added to the reaction system to terminate reaction, and the solvent was distilled off under vacuum. The resulting crude polymer was dissolved in 40 g of acetone, which was poured into 5 liters of pure water with 20 g of acetic acid dissolved therein, whereupon the polymer precipitated. The procedure of dissolving the polymer in 40 g of acetone and pouring it into 5 liters of pure water for precipitation was repeated twice, following which the polymer was separated and dried. There was obtained 15.5 g of a white polymer, 20% ethoxypropylated poly(trifluorovinyl alcohol). This polymer was found to have a weight average molecular weight (Mw) of 9,700 g/mol as measured by the light scattering method and a dispersity (Mw/Mn) of 1.67 as determined from the GPC elution curve. Proton-NMR analysis confirmed that 20% of the hydroxyl groups on poly(trifluorovinyl alcohol) was converted into ethoxypropyl.

Synthesis Example 6
tert-butoxycarbonylation of poly(trifluorovinyl alcohol)

A 500-ml flask was charged with 20 g of the poly(trifluorovinyl alcohol) obtained in Synthesis Example 2 and 250 ml of pyridine. With stirring at room temperature, 10 g of di(tert-butyl)dicarbonate in 25 ml of THF was added dropwise from a dropping funnel, followed by reaction at room temperature for one hour.

The solvent was distilled off under vacuum. The resulting crude polymer was dissolved in 40 g of acetone, which was poured into 5 liters of pure water, whereupon the polymer precipitated. The polymer was washed twice with 5 liters of pure water, following which the polymer was separated and dried. There was obtained 16.0 g of a white polymer, 18% tert-butoxycarbonylated poly(trifluorovinyl alcohol). This polymer was found to have a weight average molecular weight (Mw) of 9,400 g/mol as measured by the light scattering method and a dispersity (Mw/Mn) of 1.60 as determined from the GPC elution curve. Proton-NMR analysis confirmed that 18% of the hydroxyl groups on poly(trifluorovinyl alcohol) was converted into tert-butoxycarbonyl.

Comparative Polymers

A polymer, designated Comparative Polymer 1, was synthesized from a monodisperse polyhydroxystyrene having a molecular weight of 10,000 and a dispersity (Mw/Mn) of 1.10 by substituting tetrahydropyranyl groups for 30% of the hydroxyl groups.

Comparative Polymer 2 was poly(methyl methacrylate) having a molecular weight of 15,000 and a dispersity of 1.7. Comparative Polymer 3 was a novolac polymer having a meta/para ratio of 40/60, a molecular weight of 9,000 and a dispersity of 2.5.

Next, each of the polymers of Synthesis Examples (SE) 4 to 6 and Comparative Polymers 1 to 3, 1 g, was thoroughly dissolved in 10 g of propylene glycol monomethyl ether acetate, and passed through a 0.2-$\mu$m filter, obtaining a polymer solution.

The polymer solution was spin coated onto a $MgF_2$ substrate and baked on a hot plate at 100° C. for 90 seconds, forming a polymer layer of 300 nm thick on the $MgF_2$ substrate. Using a vacuum ultraviolet spectrometer (VUV200S by Nihon Bunko K. K.), the polymer layer was measured for transmittance at 248 nm, 193 nm and 157 nm. The results are shown in Table 1.

TABLE 1

| Polymer | Transmittance (%) at 248 nm | Transmittance (%) at 193 nm | Transmittance (%) at 157 nm |
|---|---|---|---|
| Polymer of SE4 | 85 | 15 | 50 |
| Polymer of SE5 | 87 | 14 | 45 |
| Polymer of SE6 | 86 | 16 | 40 |
| Comparative Polymer 1 | 85 | 1 | 3 |
| Comparative Polymer 2 | 90 | 70 | 1 |
| Comparative Polymer 3 | 70 | 1 | 6 |

Examples and Comparative Examples

Resist solutions were prepared in a conventional manner by formulating the polymer (in Table 1), photoacid generator, basic compound, dissolution inhibitor and solvent in the amounts shown in Table 2.

On silicon wafers, DUV-30 (Nissan Chemical K. K.) was coated to form films of 55 nm thick so that the reflectance to KrF light (248 nm) was reduced below 1%. On the coated substrates, the resist solutions were spin coated, then baked at 100° C. for 90 seconds on a hot plate to give resist films having a thickness of 300 nm.

The resist films were exposed by means of an excimer laser stepper (NSR-S202A, from Nikon Corporation; NA 0.5, σ 0.75, 2/3 zone illumination). Immediately after exposure, the resist films were baked at 110° C. for 90 seconds and then developed for 60 seconds with a 2.38% aqueous solution of tetramethylammonium hydroxide, thereby giving positive patterns except for the negative pattern in Example 8.

The resulting resist patterns were evaluated as described below. The results are shown in Tables 2 and 3.

Evaluation:

Provided that the exposure dose which provides a 1:1 resolution at the top and bottom of a 0.25-μm line-and-space pattern was the optimum exposure dose (sensitivity Eop), the minimum line width of a line-and-space pattern which was ascertained separate at this dose was the resolution of a test resist.

Dry etching tests were carried out on the spin-coated resist films by etching them under two sets of conditions.

(1) Etching test with $CHF_3/CF_4$ gas

Using a dry etching instrument TE-8500P (Tokyo Electron K. K.), the difference in resist film thickness before and after etching was determined.

The etching conditions are given below.

| chamber pressure | 40 Pa |
| --- | --- |
| RF power | 1300 W |
| gap | 9 mm |
| $CHF_3$ gas flow rate | 30 ml/min |
| $CF_4$ gas flow rate | 30 ml/min |
| Ar gas flow rate | 100 ml/min |
| time | 60 sec |

(2) Etching test with $Cl_2/BCl_3$ gas

Using a dry etching instrument L-507D-L (Nichiden Anerba K. K.), the difference in resist film thickness before and after etching was determined.

The etching conditions are given below.

| chamber pressure | 40 Pa |
| --- | --- |
| RF power | 300 W |
| gap | 9 mm |
| $Cl_2$ gas flow rate | 30 ml/min |
| $BCl_3$ gas flow rate | 30 ml/min |
| $CHF_3$ gas flow rate | 100 ml/min |
| $O_2$ gas flow rate | 2 ml/min |
| time | 360 sec |

The photoacid generators, dissolution inhibitor, basic compound and crosslinker used are shown below.

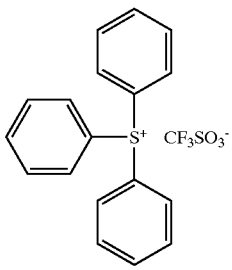

PAG1

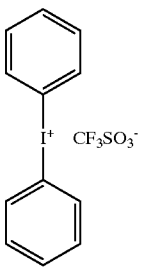

PAG2

TBA: tributylamine
TEA: triethanolamine
TMMEA: trismethoxymethoxyethylamine (as above)
PGMEA: propylene glycol methyl ether acetate

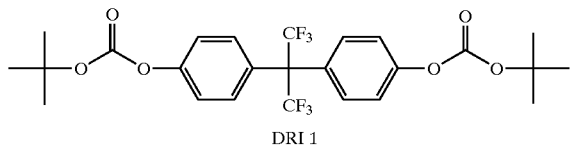

DRI 1

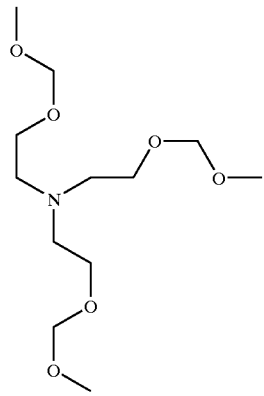

TMMEA

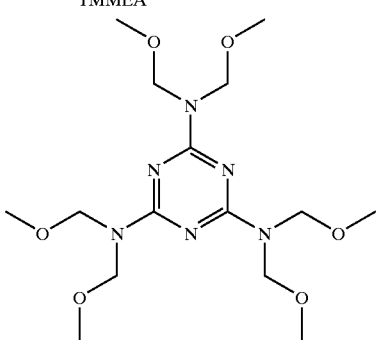

Crosslinker 1

TABLE 2

| | Polymer (pbw) | Photoacid generator (pbw) | Basic compound (pbw) | Dissolution inhibitor/ crosslinker (pbw) | Solvent (pbw) | Sensitivity (mJ/cm$^2$) | Resolution ($\mu$m) |
|---|---|---|---|---|---|---|---|
| E1 | SE4 Polymer (100) | PAG1 (2) | TBA (0.1) | — | PGMEA (1,000) | 30 | 0.24 |
| E2 | SE5 Polymer (100) | PAG1 (2) | TBA (0.1) | — | PGMEA (1,000) | 20 | 0.24 |
| E3 | SE6 Polymer (100) | PAG1 (2) | TBA (0.1) | — | PGMEA (1,000) | 24 | 0.22 |
| E4 | SE4 Polymer (100) | PAG1 (2) | TBA (0.1) | DRI1 (10) | PGMEA (1,000) | 26 | 0.22 |
| E5 | SE4 Polymer (100) | PAG2 (2) | TBA (0.1) | — | PGMEA (1,000) | 22 | 0.24 |
| E6 | SE4 Polymer (100) | PAG1 (2) | TEA (0.1) | — | PGMEA (1,000) | 25 | 0.22 |
| E7 | SE4 Polymer (100) | PAG1 (2) | TMMEA (0.2) | — | PGMEA (1,000) | 25 | 0.22 |
| E8 | SE2 Polymer (100) | PAG1 (2) | TBA (0.1) | Crosslinker1 (10) | PGMEA (1,000) | 30 | 0.24 |
| CE1 | Comparative Polymer 1 (100) | PAG1 (2) | TBA (0.1) | — | PGMEA (1,000) | 30 | 0.24 |
| CE2 | Comparative Polymer 2 (100) | PAG1 (2) | TBA (0.1) | — | PGMEA (1,000) | 25 | 0.24 |

TABLE 3

| | Polymer | CHF$_3$/CF$_4$ gas etching rate (nm/sec) | Cl$_2$/BCl$_3$ gas etching rate (nm/sec) |
|---|---|---|---|
| E1 | SE4 polymer | 120 | 220 |
| E2 | SE5 polymer | 130 | 260 |
| E3 | SE6 polymer | 120 | 160 |
| CE1 | Comparative Polymer 1 | 110 | 210 |
| CE2 | Comparative Polymer 2 | 180 | 350 |
| CE3 | Comparative Polymer 3 | 90 | 110 |

As is evident from Tables 1 to 3, resist materials using the polymers of the invention have sufficient transparency in the region of F$_2$ excimer laser (157 nm) and satisfy the resolution and sensitivity on KrF excimer laser exposure. The difference in resist film thickness before and after etching is approximate to that of polyhydroxystyrene derivative (Comparative Polymer 1), indicating superior dry etching resistance to polymethyl methacrylate (Comparative Example 2).

Japanese Patent Application No. 11-238793 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A polymer comprising recurring units of the following formula (1):

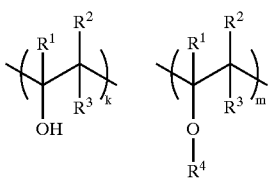

wherein at least one of $R^1$, $R^2$ and $R^3$ is fluorine or a trifluoromethyl group, and the remainder are independently hydrogen or a straight, branched or cyclic alkyl group of 1 to 20 carbon atoms, $R^4$ is an acid labile group, k and m are numbers in the range of 0<k<1 and 0<m<1, and k+m=1.

2. A resist composition comprising a polymer of the formula (1) of claim 1.

3. A process for forming a pattern, comprising the steps of:

applying the resist composition of claim 2 onto a substrate to form a coating, heat treating the coating and exposing the coating to high energy radiation with a wavelength of up to 300 nm or electron beam through a photo-mask, optionally heat treating the exposed coating, and developing the coating with a developer.

4. A chemical amplification positive resist composition comprising (A) the polymer of claim 1, (B) an organic solvent, and (C) a photoacid generator.

5. The resist composition of claim 4 further comprising (E) a basic compound.

6. The resist composition of claim 4 further comprising (F) a dissolution inhibitor.

7. A chemical amplification negative resist composition comprising (A) the polymer of claim 1, (B) an organic solvent, (C) a photoacid generator, and (D) a crosslinker.

8. The resist composition of claim 7 further comprising (E) a basic compound.

9. The polymer of claim 1, wherein the acid labile group $R^4$ is selected from groups of the formulae (3), (4) or (5), defined below, or trialkylsilyl groups whose alkyl groups each have 1 to 6 carbon atoms, and oxoalkyl groups of 4 to 20 carbon atoms;

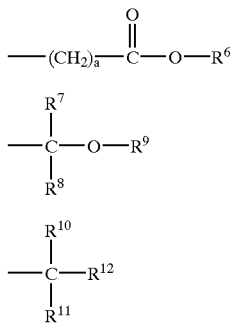

wherein:

$R^6$ is a tertiary alkyl group of 4 to 20 carbon atoms, a trialkylsilyl group whose alkyl groups each have 1 to 6 carbon atoms, an oxoalkyl group of 4 to 20 carbon atoms or a group of formula (4), letter a is an integer of 0 to 6, $R^7$ and $R^8$ are independently hydrogen or straight, branched or cyclic alkyl groups of 1 to 18 carbon atoms, $R^9$ is a monovalent hydrocarbon group of 1 to 18 carbon atoms, which optionally has a hetero atom, and optionally has one or more hydrogen atoms replaced by hydroxyl, alkoxy, oxo, amino or alkylamino groups;

additionally, a pair of $R^7$ and $R^8$, a pair of $R^7$ and $R^9$, or a pair of $R^8$ and $R^9$, taken together, may form a ring in which case each of $R^7$, $R^8$ and $R^9$ is a straight or branched alkylene group of 1 to 18 carbon atoms, $R^{10}$, $R^{11}$ and $R^{12}$ are independently monovalent hydrocarbon groups of 1 to 20 carbon atoms, which optionally contain an oxygen, sulfur, nitrogen or fluorine heteroatoms, additionally, a pair of $R^{10}$ and $R^{11}$, a pair of $R^{10}$ and $R^{12}$, or a pair of $R^{11}$ and $R^{12}$, taken together, may form a ring in which case each of $R^7$, $R^8$ and $R^9$ is a straight or branched alkylene group of 1 to 18 carbon atoms.

10. The polymer of claim 1, wherein the acid labile group $R^4$ is:

tert-butoxycarbonyl; tert-butoxycarbonylmethyl; tert-amyloxycarbonyl; tert-amyloxycarbonylmethyl; 1,1-diethylpropyloxycarbonyl; 1,1-diethylpropyloxycarbonylmethyl; 1-ethylcyclopentyloxycarbonyl; 1-ethylcyclopentyloxycarbonylmethyl; 1-ethyl-2-cyclopentenyloxycarbonyl; 1-ethyl-2-cyclopentenyloxycarbonyltmethyl; 1-ethoxyethoxycarbonylmethyl; 2-tetrahydropyranyloxycarbonylmethyl; 2-tetrahydrofuranyloxycarbonylmethyl; tetrahydrofuran-2-yl; 2-methyltetrahydrofuran-2-yl; tetrahydropyran-2-yl; 2-methyltetrahydropyran-2-yl; ethoxyethyl; butoxyethyl; ethoxypropyl; tert-butyl; triethylcarbyl; 1-ethylnorbornyl; 1-methylcyclohexyl; 1-ethylcyclopentyl; 2-(2-methyl)adamantyl; 2-(2-ethyl)adamantyl; tert-amyl; trimethylsilyl; tert-butyldimethylsilyl; 3-oxocyclohexyl; or a group of one of the following formulae:

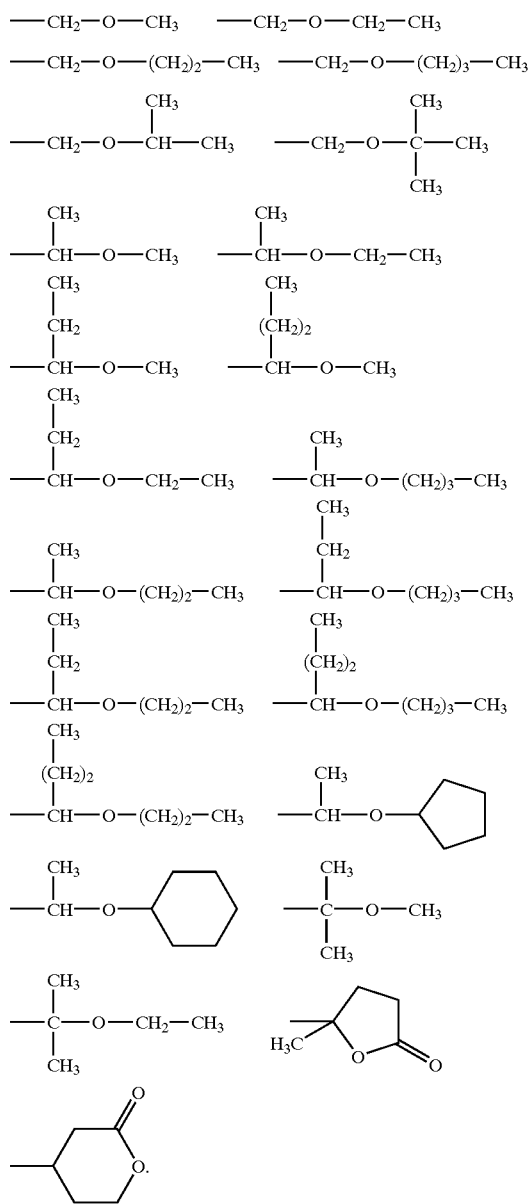

11. The polymer of claim 1, wherein $0.1 \leq k \leq 0.9$.

12. The polymer of claim 1, wherein the polymer has a weight average molecular weight of 100,000 to 1,000,000.

13. A polymer comprising recurring units of the following formula (2):

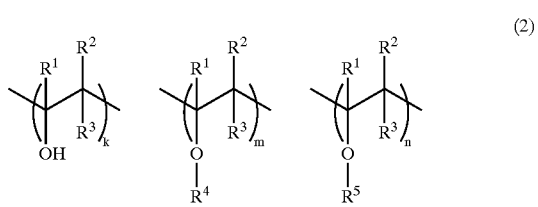

wherein at least one of $R^1$, $R^2$ and $R^3$ is fluorine or a trifluoromethyl group, and the remainder are independently hydrogen or a straight, branched or cyclic alkyl group of 1 to 20 carbon atoms, $R^4$ is an acid labile group, $R^5$ is an acid stable group, k, m and n are numbers in the range of 0<k<1, 0<m<1, and 0≦n<1, and k+m+n=1.

14. A resist composition comprising a polymer of the formula (2) of claim 13.

15. A process for forming a pattern, comprising:
applying the resist composition of claim 14 onto a substrate to form a coating,
heat treating the coating and exposing the coating to high energy radiation with a wavelength of up to 300 nm or electron beam through a photo-mask,
optionally heat treating the exposed coating, and developing the coating with a developer.

16. A chemical amplification positive resist composition comprising
(A) a polymer of claim 13,
(B) an organic solvent, and
(C) a photoacid generator.

17. The resist composition of claim 16 further comprising (E) a basic compound.

18. The resist composition of claim 16 further comprising (F) a dissolution inhibitor.

19. A chemical amplification negative resist composition comprising
(A) a polymer of claim 13,
(B) an organic solvent,
(C) a photoacid generator, and
(D) a crosslinker.

20. The resist composition of claim 19 further comprising (E) a basic compound.

21. The resist composition of claim 19 further comprising (F) a dissolution inhibitor.

22. The polymer of claim 13, wherein the acid labile group $R^4$ is selected from groups of the formulae (3), (4) or (5), defined below, or trialkylsilyl groups whose alkyl groups each have 1 to 6 carbon atoms, and oxoalkyl groups of 4 to 20 carbon atoms;

(3)

(4)

(5)

wherein:
$R^6$ is a tertiary alkyl group of 4 to 20 carbon atoms, a trialkylsilyl group whose alkyl groups each have 1 to 6 carbon atoms, an oxoalkyl group of 4 to 20 carbon atoms or a group of formula (4),
letter a is an integer of 0 to 6,
$R^7$ and $R^8$ are independently hydrogen or straight, branched or cyclic alkyl groups of 1 to 18 carbon atoms, $R^9$ is a monovalent hydrocarbon group of 1 to 18 carbon atoms, which optionally has a hetero atom, and optionally has one or more hydrogen atoms replaced by hydroxyl, alkoxy, oxo, amino or alkylamino groups;
additionally, a pair of $R^7$ and $R^8$, a pair of $R^7$ and $R^9$, or a pair of $R^8$ and $R^9$, taken together, may form a ring in which case each of $R^7$, $R^8$ and $R^9$ is a straight or branched alkylene group of 1 to 18 carbon atoms,
$R^{10}$, $R^{11}$ and $R^{12}$ are independently monovalent hydrocarbon groups of 1 to 20 carbon atoms, which optionally contain an oxygen, sulfur, nitrogen or fluorine heteroatoms,
additionally, a pair of $R^{10}$ and $R^{11}$, a pair of $R^{10}$ and $R^{12}$, or a pair of $R^{11}$ and $R^{12}$, taken together, may form a ring in which case each of $R^7$, $R^8$ and $R^9$ is a straight or branched alkylene group of 1 to 18 carbon atoms.

23. The polymer of claim 13, wherein the acid labile group $R^4$ is:
tert-butoxycarbonyl; tert-butoxycarbonylmethyl; tert-amyloxycarbonyl; tert-amyloxycarbonylmethyl; 1,1-diethylpropyloxycarbonyl; 1,1-diethylpropyloxycarbonylmethyl; 1-ethylcyclopentyloxycarbonyl; 1-ethylcyclopentyloxycarbonylmethyl; 1-ethyl-2-cyclopentenyloxycarbonyl; 1-ethyl-2-cyclopentenyloxycarbonylmethyl; 1-ethoxyethoxycarbonylmethyl; 2-tetrahydropyranyloxycarbonylmethyl; 2-tetrahydrofuranyloxycarbonylmethyl; tetrahydrofuran-2-yl; 2-methyltetrahydrofuran-2-yl; tetrahydropyran-2-yl; 2-methyltetrahydropyran-2-yl; ethoxyethyl; butoxyethyl; ethoxypropyl; tert-butyl; triethylcarbyl; 1-ethylnorbornyl; 1-methylcyclohexyl; 1-ethylcyclopentyl; 2-(2-methyl)adamantyl; 2-(2-ethyl)adamantyl; tert-amyl; trimethylsilyl; tert-butyldimethylsilyl; 3-oxocyclohexyl; or a group of one of the following formulae:

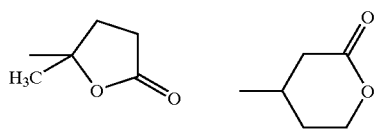

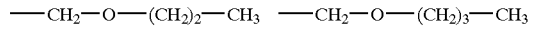

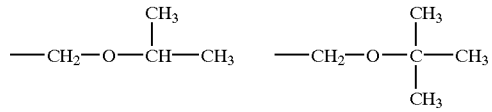

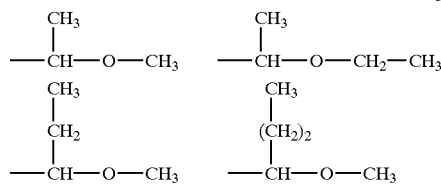

-continued
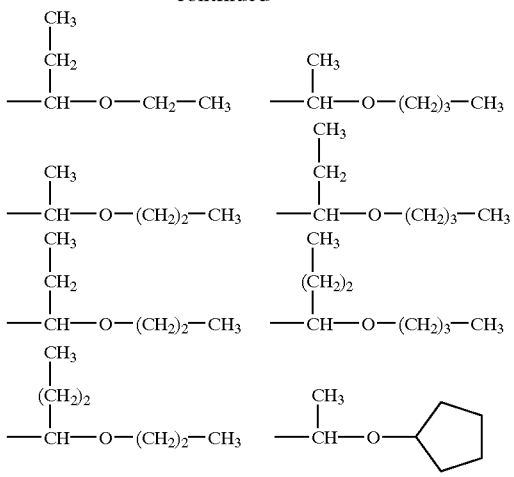
-continued
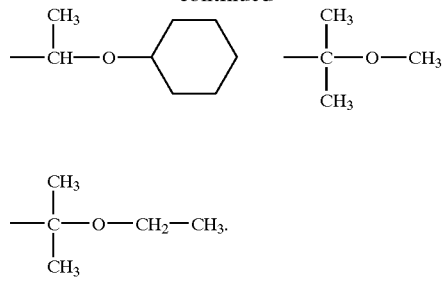
24. The polymer of claim 13, wherein the acid stable group $R^5$ is a cyclic alkyl group.
25. The polymer of claim 13, wherein $0.1 \leq k \leq 0.9$.
26. The polymer of claim 13, wherein the polymer has a weight average molecular weight of 100,000 to 1,000,000.
* * * * *